(12) United States Patent
Ward et al.

(10) Patent No.: US 9,329,502 B2
(45) Date of Patent: May 3, 2016

(54) LITHOGRAPHIC APPARATUSES AND METHODS FOR COMPENSATING FOR EIGENMODE COUPLING

(71) Applicants: ASML Holding N.V., Veldhoven (NL); ASML Netherlands B.V., Veldhoven (NL)

(72) Inventors: Christopher Charles Ward, Somerville, MA (US); Mark Henricus Wilhelmus Van Gerven, Eindhoven (NL); Bram Paul Theodoor Van Goch, Maarheeze (NL)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 258 days.

(21) Appl. No.: 13/861,053

(22) Filed: Apr. 11, 2013

(65) Prior Publication Data
US 2013/0278915 A1    Oct. 24, 2013

Related U.S. Application Data

(60) Provisional application No. 61/635,078, filed on Apr. 18, 2012.

(51) Int. Cl.
*G03F 7/20* (2006.01)
*F16F 15/00* (2006.01)

(52) U.S. Cl.
CPC .............. *G03F 7/709* (2013.01); *F16F 15/002* (2013.01); *G03F 7/70525* (2013.01); *G03F 7/70725* (2013.01); *G03F 7/70758* (2013.01); *G03F 7/70775* (2013.01)

(58) Field of Classification Search
CPC .............. F16F 15/002; G03F 7/70525; G03F 7/70725; G03F 7/70758; G03F 7/709
See application file for complete search history.

(56) References Cited

U.S. PATENT DOCUMENTS

| 2008/0018877 | A1* | 1/2008 | Butler et al. | 355/72 |
| 2008/0300726 | A1* | 12/2008 | Heiland | G05D 19/02 700/280 |
| 2011/0046795 | A1 | 2/2011 | Fujimoto et al. | |

FOREIGN PATENT DOCUMENTS

| JP | 2000-267732 A | 9/2000 |
| JP | 2009-088018 A | 4/2009 |
| WO | WO 2009/031654 A1 | 3/2009 |

* cited by examiner

*Primary Examiner* — Toan Ton
*Assistant Examiner* — Michelle M Iacoletti
(74) *Attorney, Agent, or Firm* — Sterne, Kessler, Goldstein & Fox P.L.L.C.

(57) ABSTRACT

A lithographic apparatus can include a component and a positioning system operatively coupled and configured to move the component along a first axis. The positioning system can be configured to measure a position of the component along a second axis or a third axis. The positioning system can also be configured to control movement of the component so as to compensate for an effect of eigenmode coupling between the movement of the component along the first axis and the measured position of the component along the second axis or the third axis. In some embodiments, the component is a reticle stage or a wafer stage.

8 Claims, 7 Drawing Sheets

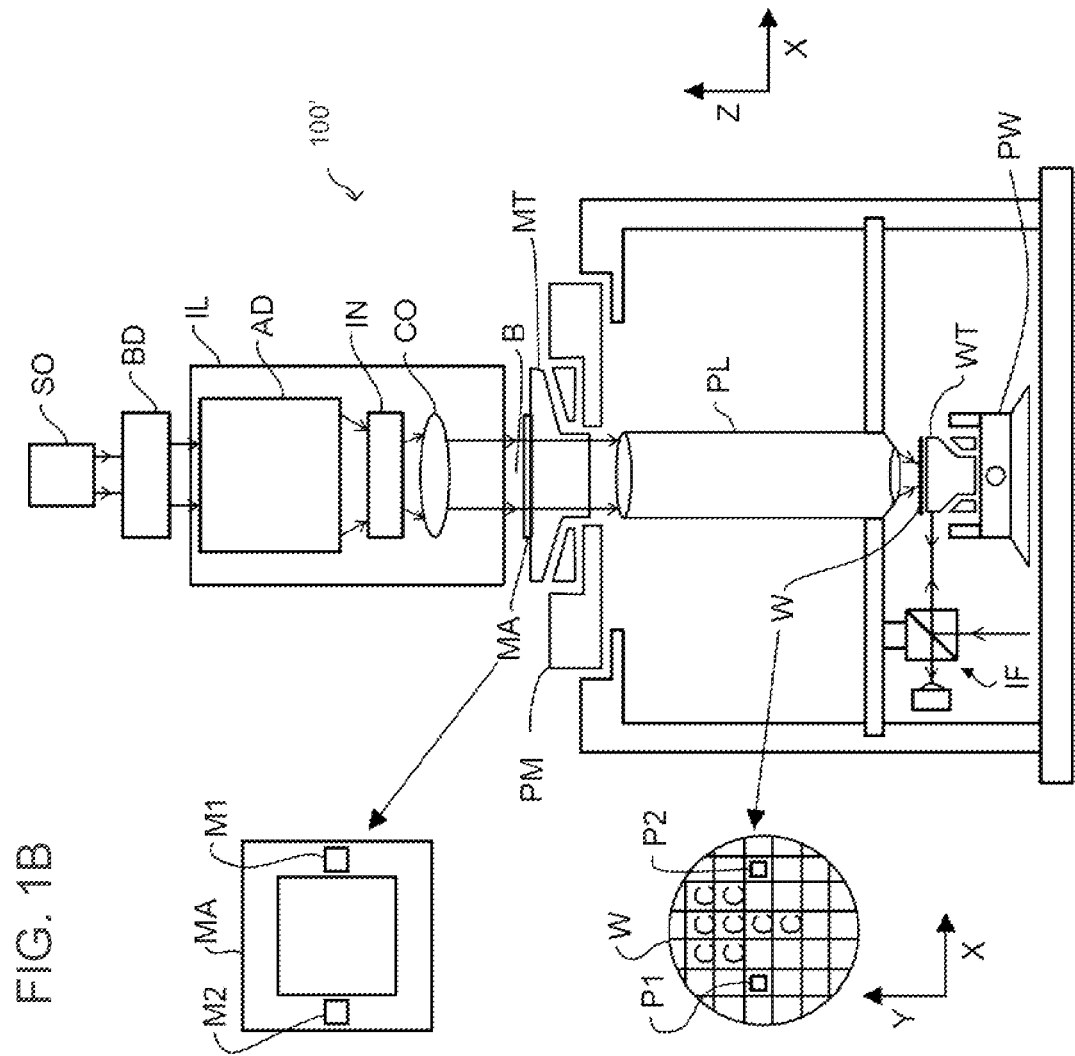

LITHOGRAPHIC APPARATUSES AND METHODS FOR COMPENSATING FOR EIGENMODE COUPLING

FIELD

Embodiments of the present invention relate to lithographic apparatuses that compensate for eigenmode coupling and relate to methods for compensating for eigenmode coupling.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, for example, a mask or a reticle, may be used to generate a circuit pattern to be formed on an individual layer of the IC. This pattern can be transferred onto a target portion (for example, including part of, one, or several dies) on a substrate (for example, a silicon wafer). Transfer of the pattern is typically via imaging onto a layer of radiation-sensitive material (resist) provided on the substrate. Generally, a single substrate will contain a network of adjacent target portions that are successively patterned. Conventional lithographic apparatuses include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The manufacture of ICs and other devices with a lithographic apparatus generally involves the replication of extremely fine sub-micron patterns that require an exceptionally high degree of positional accuracy. Thus, accurately positioning the movable components of the lithographic apparatus, for example, substrate handling components and patterning device handling components, is desirable. To accomplish such positioning, lithographic apparatuses typically use a multiple-degree-of-freedom positioning system that has one or more positioning modules to move the component and one or more position sensors to determine the position of the component. Typically, the sensors cannot discriminate between rigid body movement and non-rigid body movement of the component. Accordingly, the positioning system will detect motion of the component at the sensor location even though other portions of the component are not moving. For example, a sensor can detect motion of a patterning device support structure at the sensor locations even though the patterning device, which is coupled to the patterning device support structure, is not moving. In such cases, the lithographic apparatus will adjust the movement control of the patterning device support structure based on the detected motion, not the movement of the patterning device itself, creating real motion of the patterning device and positioning errors.

One source of non-rigid body movement is eigenmode vibrations. In a multiple-degrees-of-freedom positioning systems, an input along one axis (such as a force or position input) creates non-rigid-body eigenmode coupling motion along one or more other axes according to the eigenmode shape. This eigenmode coupling is not compensated for with existing compensation methods such as gain balancing and gain scheduling. Accordingly, there is a need for improved lithographic apparatuses and control methods that can compensate for such eigenmode coupling.

SUMMARY

In some embodiments, a lithographic apparatus can include a component and a positioning system operatively coupled to and configured to move the component along a first axis. The positioning system can also be configured to measure a position of the component along a second axis. Further, the positioning system can be configured to control movement of the component so as to compensate for an effect of eigenmode coupling between the movement of the component along the first axis and the measured position of the component along the second axis. In some embodiments, the component is a reticle stage or a wafer stage.

In another embodiment, a method includes moving a component of a lithographic apparatus along a first axis and measuring a position of the component along a second axis. The method can also include moving the component along the second axis so as to compensate for an effect of eigenmode coupling between the movement of the component along the first axis and the measured position of the component along the second axis. In some embodiments, the component is a reticle stage or a wafer stage.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIGS. 1A and 1B respectively depict reflective and transmissive lithographic apparatuses, according to one embodiment of the present invention.

Figure 1A:
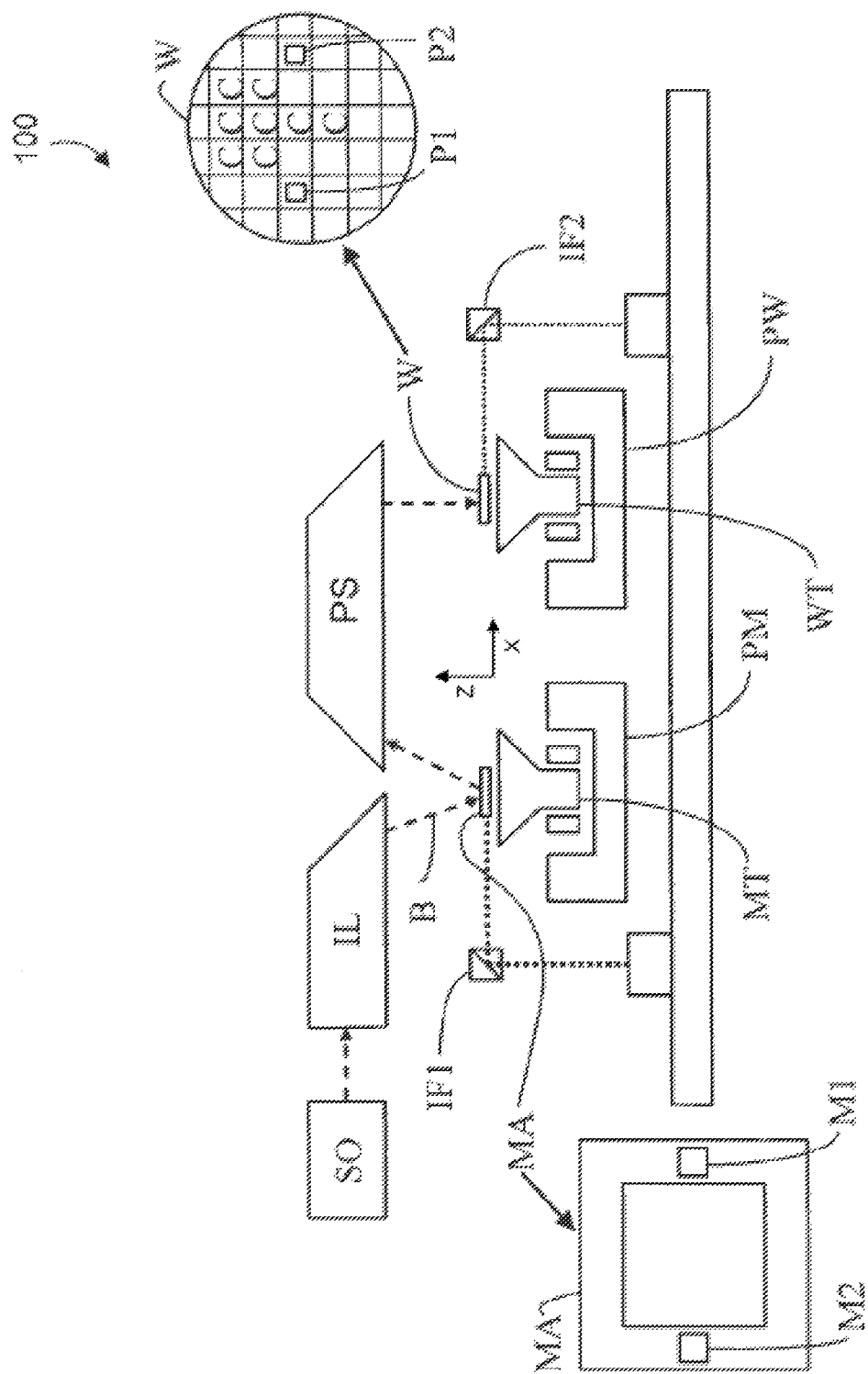

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses embodiments that incorporate the features of this invention. The disclosed embodiments merely exemplify the invention. The scope of the invention is not limited to the disclosed embodiments. The invention is defined by the claims appended hereto.

The embodiments described, and references in the specification to "one embodiment," "an embodiment," "an example embodiment," etc., indicate that the embodiments described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

In some embodiments, a lithographic apparatus can include an extreme ultraviolet (EUV) source, which is configured to generate a beam of EUV radiation for EUV lithography. In general, the EUV source is configured in a radiation system (see below), and a corresponding illumination system is configured to condition the EUV radiation beam of the EUV source.

In the embodiments described herein, the terms "lens" and "lens element," where the context allows, may refer to any one or combination of various types of optical components, comprising refractive, reflective, magnetic, electromagnetic and electrostatic optical components.

Further, the terms "radiation" and "beam" used herein encompass all types of electromagnetic radiation, comprising ultraviolet (UV) radiation (for example, having a wavelength λ of 365, 248, 193, 157 or 126 nm), extreme ultra-violet (EUV or soft X-ray) radiation (for example, having a wavelength in the range of 5-20 nm, for example, 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths, which can be produced by a mercury discharge lamp: G-line 436 nm; H-line 405 nm; and/or I-line 365 nm. Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within the lithographic apparatus. It should be appreciated that radiation having a wavelength in the range of, for example, 5-20 nm relates to radiation with a certain wavelength band, of which at least part is in the range of 5-20 nm.

Before describing such embodiments in more detail, however, it is instructive to present an example environment in which embodiments of the present invention may be implemented.

FIGS. 1A and 1B schematically depict lithographic apparatus 100 and lithographic apparatus 100', respectively. Lithographic apparatus 100 and lithographic apparatus 100' each include: an illumination system (illuminator) IL configured to condition a radiation beam B (for example, DUV or EUV radiation); a support structure (for example, a mask table) MT configured to support a patterning device (for example, a mask, a reticle, or a dynamic patterning device) MA and connected to a first positioning system PM configured to accurately position the support structure MT and the patterning device MA; and a substrate table (for example, a wafer table) WT configured to hold a substrate (for example, a resist coated wafer) W and connected to a second positioning system PW configured to accurately position the substrate table WT and the substrate W. Lithographic apparatuses 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS is reflective, and in lithographic apparatus 100', the patterning device MA and the projection system PS is transmissive.

The illumination system IL may include various types of optical components, such as refractive, reflective, magnetic, electromagnetic, electrostatic or other types of optical components, or any combination thereof, for directing, shaping, or controlling the radiation B.

The support structure MT holds the patterning device MA in a manner that depends on the orientation of the patterning device MA, the design of the lithographic apparatuses 100 and 100', and other conditions, for example, whether or not the patterning device MA is held in a vacuum environment. The support structure MT may use mechanical, vacuum, electrostatic or other clamping techniques to hold the patterning device MA. The support structure MT may be a frame or a table, for example, which may be fixed or movable, as required. The support structure MT may ensure that the patterning device is at a desired position, for example, with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B which is reflected by the mirror matrix.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables WT and/or two or more support structures MT. In such "multiple stage" machines, the additional substrate tables WT or support structures MT may be used in parallel, or preparatory steps may be carried out on one or more tables while one or more other substrate tables WT or support structures MT are being used for exposure.

Referring to FIGS. 1A and 1B, the illuminator IL receives a radiation beam from a radiation source SO. The source SO and the lithographic apparatuses 100 or 100' may be separate entities, for example, when the source SO is an excimer laser. In such cases, the source SO is not considered to form part of the lithographic apparatuses 100 or 100', and the radiation beam B passes from the source SO to the illuminator IL with the aid of a beam delivery system BD (FIG. 1B) comprising, for example, suitable directing mirrors and/or a beam expander. In other cases, the source SO may be an integral part of the lithographic apparatuses 100 or 100', for example, when the source SO is a mercury lamp. The source SO and the illuminator IL, together with the beam delivery system BD, if required, may be referred to as a radiation system.

The illuminator IL may comprise an adjuster AD (FIG. 1B) for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may comprise various other components (FIG. 1B), such as an integrator IN and a condenser CO. The illuminator IL may be used to condition the radiation beam B, to have a desired uniformity and intensity distribution in its cross section.

Referring to FIG. 1A, the radiation beam B is incident on the patterning device (for example, a mask or reticle) MA, which is held on the support structure (for example, a mask table or reticle stage) MT, and is patterned by the patterning device MA. In lithographic apparatus 100, the radiation beam B is reflected from the patterning device MA. After being reflected from the patterning device MA, the radiation beam B passes through the projection system PS, which focuses the radiation beam B onto a target portion C of the substrate W. With the aid of the second positioning system PW, which can include one or more force actuators (for example, servomechanisms or any other suitable force actuators) and one or more position sensors IF2 (for example, an interferometric device, linear encoder, a capacitive sensor, or any other suitable position sensing device) in some embodiments, the substrate table WT and substrate W may be moved accurately, for example, so as to position different target portions C in the path of the radiation beam B. Similarly, the first positioning system PM, which can include one or more force actuators (for example, servomechanisms or any other suitable force actuators) and one or more position sensors IF1 (for example, an interferometric device, linear encoder, a capacitive sensor, or any other suitable position sensing device) in some embodiments, may be used to accurately position the support structure MT and the patterning device MA with respect to the path of the radiation beam B. Patterning device MA and substrate W may be aligned using mask alignment marks M1, M2 and substrate alignment marks P1, P2.

In some embodiments, positioning systems PW and PM can be configured to move the substrate table WT and substrate W, and the support structure MT and the patterning device MA, respectively, with multiple degrees of freedom, for example, along three perpendicular axes and rotation about one or more of the axes.

Referring to FIG. 1B, the radiation beam B is incident on the patterning device (for example, a mask or reticle) MA, which is held on the support structure (for example, a mask table or wafer stage) WT, and is patterned by the patterning device. Having traversed the patterning device MA, the radiation beam B passes through the projection system PS, which focuses the beam onto a target portion C of the substrate W. With the aid of the second positioning system PW, which can include one or more force actuators (for example, servomechanisms or any other suitable force actuators) and one or more position sensor IF (for example, an interferometric device, linear encoder, capacitive sensor, or any other suitable position sensing device) in some embodiments, the substrate table WT and substrate W can be moved accurately, for example, so as to position different target portions C in the path of the radiation beam B. Similarly, the first positioning system PM, which can include one or more force actuators (for example, servomechanisms or any other suitable force actuator) and one or more position sensors (for example, an interferometric device, linear encoder, a capacitive sensor, or any other suitable position sensing device, and which are not shown in FIG. 1B) in some embodiments, can be used to accurately position the support structure MT and patterning device MA with respect to the path of the radiation beam B, for example, after mechanical retrieval from a mask library, or during a scan.

Generally, movement of the support structure MT may be realized with the aid of a long-stroke module (coarse positioning) and a short-stroke module (fine positioning), which form part of the first positioning system PM. Similarly, movement of the substrate table WT may be realized using a long-stroke module and a short-stroke module, which form part of the second positioning system PW. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks as illustrated occupy dedicated target portions, they may be located in spaces between target portions (known as scribe-lane alignment marks). Similarly, in situations in which more than one die is provided on the mask MA, the mask alignment marks may be located between the dies.

The lithographic apparatuses 100 and 100' may be used in at least one of the following modes:

1. In step mode, the support structure (for example, mask table or wafer stage) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure MT and the substrate table WT are scanned synchronously while a pattern imparted to the radiation beam B is projected onto a target portion C (i.e., a single dynamic exposure). The velocity and direction of the substrate table WT relative to the support structure MT may be determined by the (de-) magnification and image reversal characteristics of the projection system PS.

3. In another mode, the support structure MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to herein.

Combinations and/or variations on the described modes of use or entirely different modes of use may also be employed.

Figure 2:
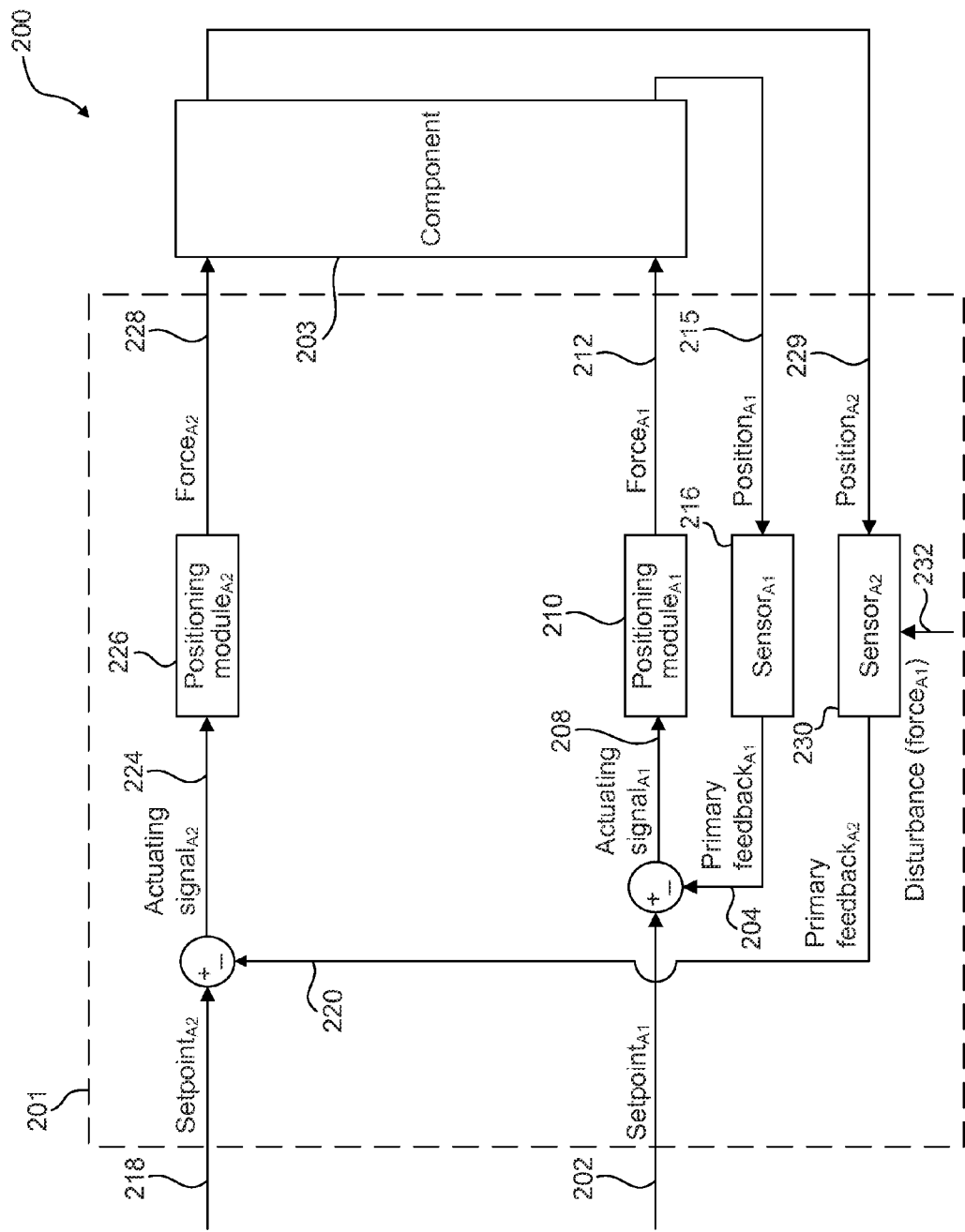
FIG. 2 illustrates a block-diagram representation of a feedback control system according to an embodiment.

FIG. 2 illustrates a block-diagram representation of a feedback control system 200 according to an embodiment. In some embodiments, control system 200 may be a multiple degree-of-freedom control system. Control system 200 includes a positioning system 201, for example, positioning system PM or positioning system PW of lithographic apparatuses 100 or 100' shown in FIGS. 1A and 1B. Positioning system 201 moves a component 203 of a lithographic apparatus. For example, component 203 may comprise support structure MT and patterning device MA, or substrate table WT of lithographic apparatuses 100 or 100' shown in FIGS. 1A and 1B. In some embodiments, positioning system 201 can be configured to move component 203 along two or more axes, for example, three, four, five, six, or more than six axes. In this application, "to move along an axis," "movement along an axis," "moved along an axis," or similar phrases mean translation along the axis or rotation about the axis. In some embodiments, positioning system 201 can be configured to move component 203 along six axes that are perpendicular to each other. For example, positioning system 201 can be configured to translate component 203 along an x-axis, a y-axis, and a z-axis and to rotate component 203 about the x-axis, the y-axis, and the z-axis.

Although FIG. 2 illustrates a positioning system in which component 203 is moved along two axes, positioning system 201 may include additional sensors and positioning modules to position the component along additional axes.

In some embodiments, positioning system 201 includes one or more positioning modules configured to move component 203 along one or more axes and/or about one or more axes. For example, as shown in FIG. 2, positioning system 201 can include a first positioning module 210 and a second positioning module 226. Positioning module 210 can be configured to move component 203 along a first axis, and positioning module 226 can be configured to move component 203 along a second axis. In some embodiments, positioning module 210 and positioning module 226 can each include a control unit, for example, a digital processor, discrete circuit(s), analog circuit(s), or any other suitable control device, and one or more force actuators (not shown), for example, servomechanisms or any other suitable force actuators. In some embodiments, the control unit of positioning module 210 and positioning module 226 is the same control unit. In some embodiments, positioning module 210 and positioning module 226 may have separate control units. The control unit(s) control the magnitudes and directions of one or more forces applied by the force actuators to component 203 to achieve a desired movement of component 203. In some embodiments, positioning modules 210 and 226 may include one or more signal conditioners or filters. In some embodiments, positioning module 210 or 226 may be a servomechanism controller comprising a control unit and one or more servomechanisms. Each servomechanism controller can have a bandwidth at which it operates.

In some embodiments, positioning system 201 includes one or more position sensors (for example, an interferometric device, linear encoder, a capacitive sensor, or any other suitable position sensing device) configured to measure the position of component 203. As shown in FIG. 2, positioning system 201 may include a first position sensor 216 configured to measure a position (position$_{A1}$ schematically illustrated at 215) of component 203 along a first axis and to generate a primary feedback signal 204. Primary feedback signal 204 is a signal that is a function of the measured position of component 203 along the first axis. Positioning system 201 can also include a second position sensor 230 that is configured to measure a position (position$_{A2}$ schematically illustrated at 229) of component 203 along a second axis and to generate a primary feedback signal 220. Primary feedback signal 220 is a signal that is a function of the measured position of component 203 along the second axis.

As shown in FIG. 2, positioning system 201 receives a set point signal 202, which is a signal that represents the desired position of component 203 along the first axis. Positioning system 201 compares set point signal 202 to primary feedback signal 204 to generate an actuating signal 208 (for example, an servomechanism error signal). In some embodiments, actuating signal 208 is the difference between set point signal 202 and primary feedback signal 204.

Positioning module 210 receives actuating signal 208 and applies one or more control forces (force$_{A1}$ schematically illustrated at 212) having certain magnitudes and directions based on actuating signal 208. Positioning module 210 is configured such that force$_{A1}$ (212) moves component 203 along the first axis. Position sensor 216 measures position$_{A1}$ (215) of component 203 along the first axis and generates primary feedback signal 204.

Positioning system 201 can also receive a set point signal 218, which is a signal that represents the desired position of component 203 along a second axis. Positioning system 201 compares set point signal 218 to primary feedback signal 220 to generate an actuating signal 224 (for example, a servomechanism error signal). In some embodiments, actuating signal 224 is the difference between set point signal 218 and primary feedback signal 220.

Positioning module 226 receives actuating signal 224 and applies one or more control forces (force$_{A2}$ schematically illustrated at 228) having a certain magnitude and direction based on actuating signal 224. Positioning module 226 is configured such that force$_{A2}$ (228) moves component 203 along the second axis. Position sensor 230 measures position$_{A2}$ (229) of component 203 along the second axis and generates primary feedback signal 220.

Although FIG. 2 illustrates a single sensor for both sensor 216 and sensor 230, positioning system 201 can include multiple sensors 216 and sensors 230 for detecting the position of component 203 along the first and second axis. In some embodiments, sensor 216 and sensor 230 may be the same sensor.

Set point signal 202, set point signal 218, actuating signal 208, primary feedback signal 204, actuating signal 224, and primary feedback signal 220 may each comprise one or more analog or digital signals, which is an implementation detail that would become apparent to a person skilled in the art.

Non-rigid body, mechanical coupling between the first axis and the second axis may result from self-excited eigenmode vibrations. For example, there can be eigenmode coupling between actuation along the first axis and the feedback sensing along the second axis. In other words, moving component 203 along the first axis with force$_{A1}$ (212) can create a non-rigid body position disturbance (schematically illustrated at 232), which is detected by sensor 230. In some embodiments in which the positioning modules 210 and 226 are servomechanism controllers, disturbance 232 may be above the bandwidth of the servomechanism controllers.

In some embodiments, sensor 230 cannot discriminate between rigid body movement and non-rigid body movement, and thus, the generated primary feedback signal 220 will include disturbance 232 even though other portions of component 203 may not be moving. Thus, positioning module 226 adjusts the movement control of component 203 along the second axis based on primary feedback signal 220. A positional error of component 203 along the second axis may be created because primary feedback signal 220 may include disturbance 232. In some embodiments, this positional error can be amplified if positioning system 201 uses a high performance feed forward signal from another moving component of the lithographic apparatus, for example, a feed forward signal from the substrate support WT.

Figure 3:
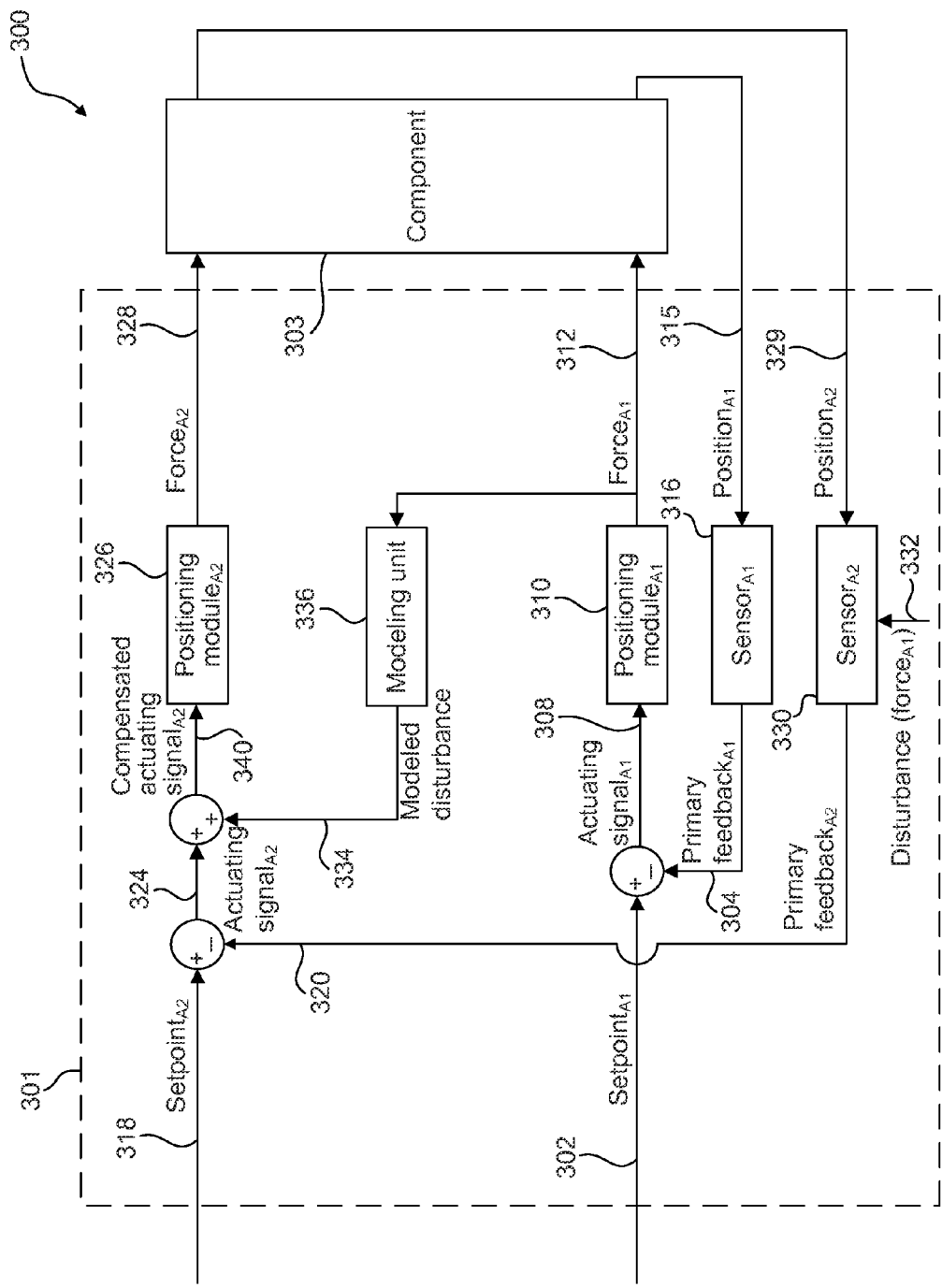
FIG. 3 illustrates a block-diagram representation of a feedback control system according to another embodiment.

Accordingly, in some embodiments, a lithographic apparatus can include a positioning system configured to control movement of a component of a lithographic apparatus so as to compensate for an effect of eigenmode coupling between the movement of a component along a first axis and the measured position of the component along a second axis. FIG. 3 illustrates a block-diagram representation of a feedback control system 300 according to one such embodiment.

Control system 300 includes a positioning system 301 configured to control movement of a component 303 of a lithographic apparatus so as to compensate for an effect of eigenmode coupling between the movement of component 303 along a first axis and the measured position of component 303 along a second axis. Control system 300 includes similar features as the above described control system 200. These similar features are similarly numbered and function substantially the same as they do in control system 200. Namely, positioning system 301 includes positioning modules 310 and 326 that can be configured to move component 303 along the first axis and the second axis, respectively. Positioning system 301 can also include position sensors 316 and 330 for detecting the position of component 303 along the first and second axes, respectively. In some embodiments, component 303 can be support structure MT and patterning device MA, or substrate table WT of lithographic apparatuses 100 or 100' shown in FIGS. 1A and 1B. Positioning system 301 can be configured to move component 303 along two or more axes, for example, two, three, four, five, six, or more than six axes. In some embodiments, positioning system 301 can be configured to move component 303 along six axes. For example, positioning system 301 can be configured to translate component 303 along perpendicular x-, y-, and z-axes and to rotate component 303 about the x-, y-, and z-axes.

As shown in FIG. 3, control system 300 can include a modeling unit 336 to compensate for mechanical coupling between the first and second axes. For example, modeling unit 336 may include a compensation model that is indicative of a non-rigid body, mechanical coupling between the first and second axes. In some embodiments, modeling unit 336 may predict a disturbance (schematically illustrated at 332) detected by position sensor 330. Disturbance 332 may be caused by self-excited eigenmode mechanical resonances created by moving component 303 along the first axis with one or more control forces (force$_{A1}$ schematically illustrated at 312) applied by positioning module 310.

Figure 6:
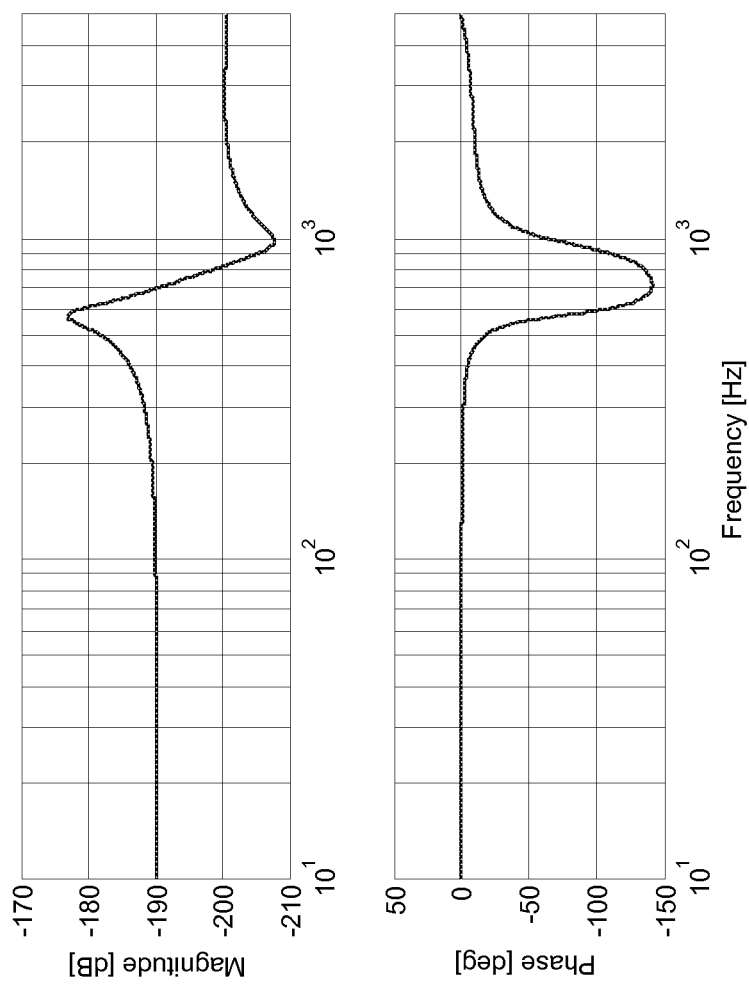
FIG. 6 illustrates a frequency response of an exemplary eigenmode model description.

In some embodiments, modeling unit 336 may generate a modeled disturbance signal 334 (for example, a coupling signal). Modeling unit 336 can use any suitable compensation model that describes the mechanical coupling between the first and second axes. In some embodiments, modeling unit 336 can be configured to compensate for an effect of eigenmode coupling between the movement of component 303 along the first axis (for example, a translation of component 303 along the first axis) and a measured position of component 303 along the second axis. Particularly, modeled disturbance signal 334 may indicate the predicted positional displacement along the second axis that is attributed to eigenmode disturbance 332, detectable by sensor 330. For example, modeling unit 336 may use a model description of one or more eigenmode disturbances that are being compensated. Various eigenmode model descriptions are known to persons skilled the art. In some embodiments, modeling unit 336 may be configured to use control force$_{A1}$ (312), which moves component 303 along the first axis, in conjunction with the compensation model to generate modeled disturbance signal 334. In some embodiments, the predicted positional displacement attributed to eigenmode coupling along the second axis can be a function of force$_{A1}$ (312) applied to component 303 to move component 303 along the first axis. In some embodiments, modeling unit 336 can use a model description that has a frequency response as shown in FIG. 6. In some embodiments, the model description used by modeling unit 336 can be calibrated using frequency-domain or time-domain optimization methods, among other known calibration methods.

In some embodiments, the modeled disturbance signal 334 is combined with an actuating signal 324 (for example, a servomechanism error signal) to generate a compensated actuating signal 340 (for example, a compensated servomechanism error signal). In some embodiments, modeled disturbance signal 334 may be summed with actuating signal 348 using a summer (as shown in FIG. 3) to generate compensated actuating signal 340. Positioning module 326 receives compensated actuating signal 324 and applies one or more control forces (force$_{A2}$ schematically illustrated at 328) having certain magnitudes and directions based on compensated actuating signal 340. Accordingly, in some embodiments, disturbance 332 and its resulting motion is hid from positioning module 326. Positioning module 326 can be configured such that force$_{A2}$ (328) moves component 303 along the second axis in a manner that compensates for disturbance 332, which is detected by sensor 330. In such embodiments, positioning module 326 may ignore a portion of primary feedback signal 320 that is attributed to disturbance 332 so that positioning module 326 does not amplify any position errors. Thus, positioning system 301 may be configured to provide a true position error of component 303 along the second axis to positioning module 326. Accordingly, positional errors attributed to non-rigid body disturbance 332 can be reduced or eliminated.

In some embodiments, the positioning system 301 and modeling unit 336 may be configured to dynamically decouple the first axis from the second axis.

Although not shown in FIG. 3, positioning system 301 can include a third positioning module configured to move component 303 along a third axis in some embodiments. For example, positioning system 301 can be configured to move component 303 along an x-axis, a y-axis, and a z-axis. In some embodiments, the first axis in FIG. 3 is the z-axis that is related to focus, and the second axis is the x-axis that is related to imaging and overlay.

Table 1 below shows the magnitude of the translation positioning errors along the x- and z-axes obtained moving a reticle stage using the following: (1) a control system similar to the one depicted in FIG. 2 in which set point signals 202 and 218 are based on standard performance feed forward signals; (2) a control system similarly to the one depicted in FIG. 2 in which set point signals 202 and 218 are based on high performance feed forward signals; and (3) a control system similar to the one depicted in FIG. 3 in which set point signals 302 and 318 are based on high performance feed forward signals. All values are in nanometers.

The moving average MA is the low frequency portion of the positioning error, and the moving standard deviation MSD is the high frequency portion of the positioning error. Regarding translation along the x- and y-axes and rotation about the z-axis, MA errors correlate with overlay errors. Regarding translation along the z-axis, MA errors correlate with focus performance. Regarding translation along the x- and y-axes, MSD errors correlate with image blurring and affect the critical dimension unit. MSD translation errors along the x- and y-axes can also lead to image streaking Regarding translation along the z-axis, MSD errors also correlate with focus performance.

TABLE 1

|  | Control System 200, Standard | Control System 200, High Performance | Control System 300, High Performance |
| --- | --- | --- | --- |
| MA x | 0.51 | 0.56 | 0.54 |
| MSD x | 4.89 | 5.83 | 5.29 |
| MA z | 12.53 | 10.37 | 10.50 |
| MSD z | 25.10 | 20.84 | 21.18 |

Table 2 below shows the number of vertical streaks that occurred on six different wafers when moving a reticle stage using the following control systems: (1) a control system depicted in FIG. 2 in which set point signals 202 and 218 are based on a standard performance feed forward signals; (2) a control system depicted in FIG. 2 in which set point signals 202 and 218 are based on a high performance feed forward signals; and (3) a control system depicted in FIG. 3 in which set point signals 302 and 318 are based on a high performance feed forward signal. The vertical streaks can be caused by high MSD errors in the x-axis.

TABLE 2

| Wafer | Control System 200, Standard | Control System 200, High Performance | Control System 300, High Performance |
| --- | --- | --- | --- |
| 1 | 5 | 17 | 7 |
| 2 | 3 | 14 | 8 |
| 3 | 7 | 19 | 7 |
| 4 | 1 | 17 | 4 |
| 5 | 6 | 8 | 6 |
| 6 | 10 | 6 | 4 |

As can be seen in Tables 1 and 2, a control system similar to the one depicted in FIG. 3 can help reduce the MSD errors in the x-axis while substantially maintaining the improved performance in the z-axis from using the performance feed forward signal.

Modeled disturbance signal 334 and compensated actuating signal 340 may each comprise one or more digital or analog signals, which is an implementation detail that would become apparent to a person skilled in the art.

Figure 4:
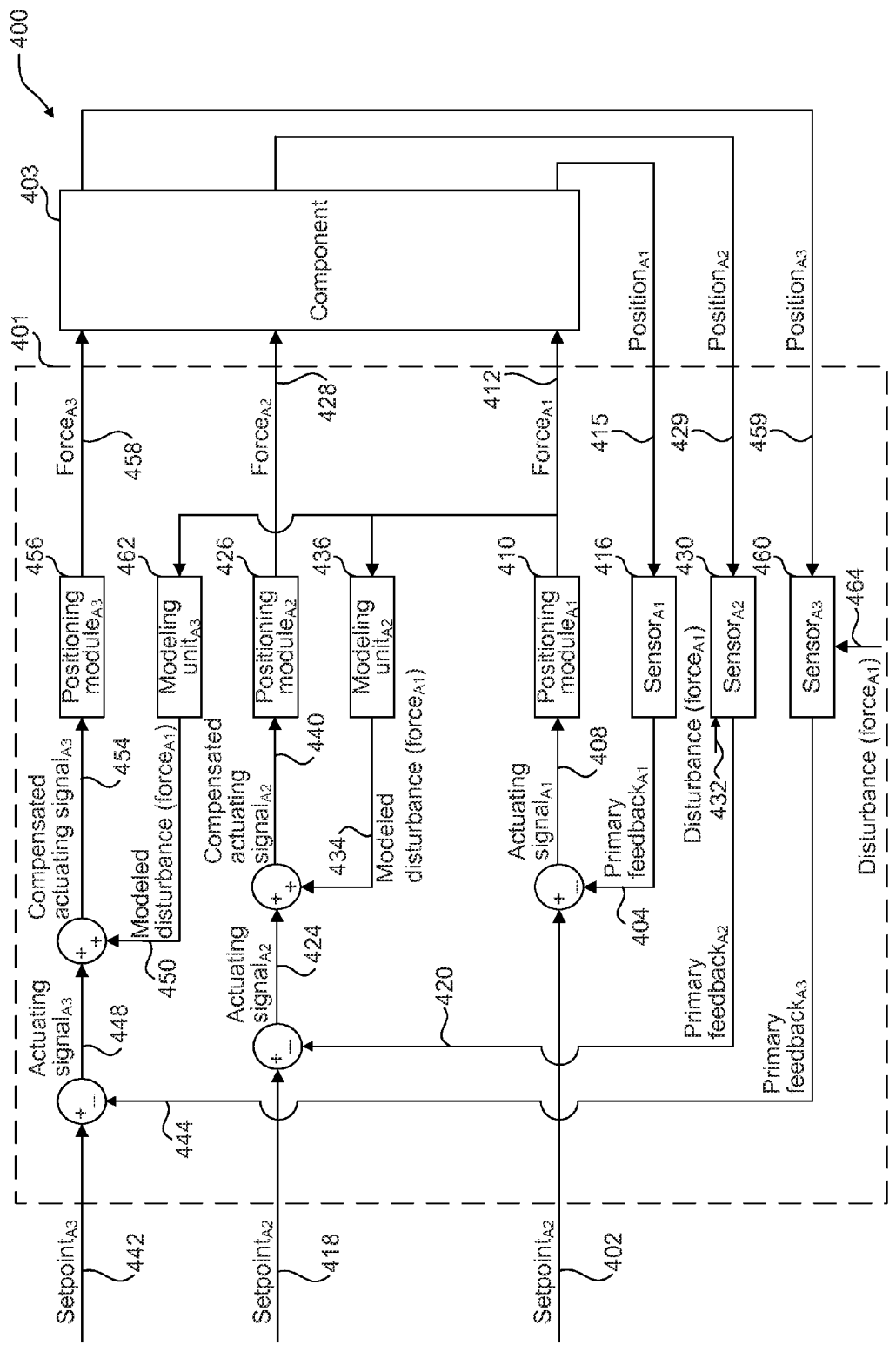
FIG. 4 illustrates a block-diagram representation of a feedback control system according to yet another embodiment.

In some embodiments, a lithographic apparatus can include a positioning system configured to control movement of a component of the lithographic apparatus so as to compensate for an effect of eigenmode coupling between the movement of component along a first axis and the measured position of the component along a second axis and a third axis. FIG. 4 illustrates a block-diagram representation of a feedback control system 400 according to one such embodiment.

Control system 400 includes a positioning system 401 configured to control movement of a component 403 of a lithographic apparatus so as to compensate for an effect of eigenmode coupling between the movement of component 403 along a first axis and the measured position of component 403 along a second axis and along a third axis. Control system 400 includes similar features as the above described control systems 200 and 300. These similar features are similarly numbered and function substantially the same as they do in control systems 200 and 300.

As shown in FIG. 4, positioning system 401 can receive a set point signal 442, which is a signal that represents the desired position of component 403 along a third axis. Positioning system 401 compares set point signal 442 to a primary feedback signal 444. Primary feedback signal 444 is a signal that is a function of the measured position of component 403 along the third axis. In some embodiments, actuating signal 448 is the difference between set point signal 442 and primary feedback signal 444.

Control system 400 includes a second modeling unit 462 to compensate for mechanical coupling between the first and third axes. For example, modeling unit 462 may include a compensation model that is indicative of a non-rigid body, mechanical coupling between the first and third axes. In some embodiments, modeling unit 462 may predict a disturbance (schematically illustrated at 464) that is detected by sensor 460. Disturbance 464 may be caused by self-excited eigenmode mechanical resonances created by moving component 403 along a first axis with one or more control forces (force$_{A1}$ schematically illustrated at 412) applied by positioning module 410.

In some embodiments, modeling unit 462 may generate a modeled disturbance signal 450 (for example, a coupling signal). Modeling unit 462 can use any suitable compensation model that describes the mechanical coupling between the first and third axes. In some embodiments, modeling unit 462 can be configured to compensate for an effect of eigenmode coupling between the movement of component 403 along the first axis and a measured position of component 403 along the second axis. Particularly, modeled disturbance signal 450 may indicate the predicted positional displacement along the third axis that is attributed to eigenmode disturbance 464. Modeling unit 462 can use any suitable model description of one or more eigenmode disturbances, for example, disturbance 464, that are being compensated. In some embodiments, modeling unit 462 may be configured to use control force$_{A1}$ (412), which moves component 403 along the first axis, in conjunction with the compensation model to generate modeled disturbance signal 450. In some embodiments, the prediction of the measured positional displacement along the third axis can be based on force$_{A1}$ (412) applied to component 403. Various eigenmode model structures are known to persons skilled the art. In some embodiments, the model description used by modeling unit 462 can be calibrated using frequency-domain or time-domain optimization methods, among other known calibration methods.

In some embodiments, the modeled disturbance signal 450 is combined with actuating signal 448 to generate a compensated actuating signal 454 (for example, a compensated servomechanism error signal). For example, in some embodiments, modeled disturbance signal 450 may be summed with actuating signal 448 using a summer (as shown in FIG. 4) to generate compensated actuating signal 454. Positioning system 401 also includes positioning module 456 that receives compensated actuating signal 454 and applies one or more control forces (force$_{43}$ schematically illustrated at 458) having certain magnitudes and directions based on compensated actuating signal 454. Accordingly, in some embodiments, disturbance 464 and its resulting motion is hid from positioning module 456. Positioning module 456 can be configured such that force$_{43}$ (458) moves component 403 along the third axis in a manner that compensates for disturbance 464 at sensor 460. In such embodiments, positioning module 456 may ignore a portion of primary feedback signal 444 that is attributed to disturbance 464 so that positioning module 456 does not amplify any position errors. Thus, positioning system 401 may be configured to provide a true position error of component 403 along the third axis to positioning module 456. Accordingly, positional errors attributed to non-rigid body disturbance 464 can be reduced or eliminated.

In some embodiments, the positioning system 401 and modeling unit 462 may be configured to dynamically decouple the first axis from the third axis.

In some embodiments, positioning modules 456, 426, and 410 each include a control unit, for example, a digital processor, discrete circuit(s), analog circuit(s), or any other suitable control device, and one or more actuators, for example, servomechanisms or any other suitable force actuator. In some embodiments, the control units of positioning modules 410, 426, and 456 are the same control unit, for example, the same digital processor. In some embodiments, positioning modules 410, 426, and 456 may have separate control units. The control unit(s) control the magnitudes and directions of the forces applied by the actuators to component 403 to achieve a desired movement of component 403.

In some embodiments, positioning system 401 also includes position sensor 460 configured to measure a position (position$_{43}$ schematically illustrated at 459) of component 403 along the third axis and to generate primary feedback signal 444.

In some embodiments, component 403 can be support structure MT and patterning device MA, or substrate table WT of lithographic apparatuses 100 or 100' shown in FIGS. 1A and 1B. Positioning system 401 can be configured to move component 403 along three or more axes, for example, three, four, five, six, or more than six axes. In some embodiments, positioning system 401 can be configured to move component 403 along six axes. For example, positioning system 401 can be configured to translate component 403 along perpendicular x-, y-, and z-axes and to rotate component 403 about the x-, y-, and z-axes.

Figure 5:
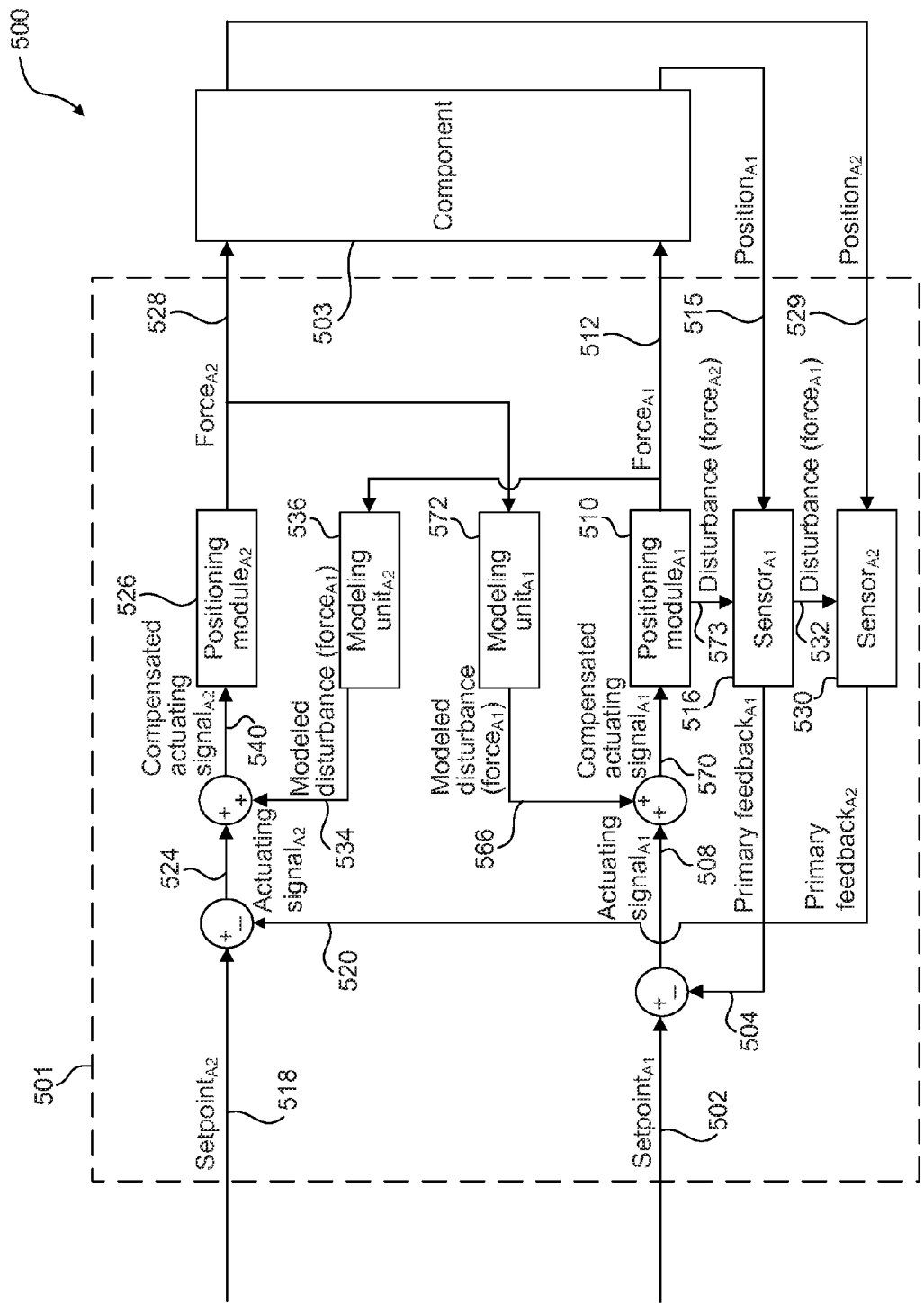
FIG. 5 illustrates a block-diagram representation of a feedback control system according to another embodiment.

In some embodiments, a lithographic apparatus can include a positioning system configured to control movement of a component of the lithographic apparatus so as to also compensate for an effect of eigenmode coupling between the movement of component along a first axis and the measured position of the component along a second axis and for an effect of eigenmode coupling between the movement of component along the second axis and the measured position of the component along the first axis. FIG. 5 illustrates a block-diagram representation of a feedback control system 500 according to one such embodiment.

Control system 500 includes a positioning system 501 configured to control movement of a component 503 of a lithographic apparatus so as to compensate for an effect of eigenmode coupling between the movement of component 503 along a first axis and the measured position of component 503 along a second axis, and for an effect of eigenmode coupling between the movement of component 503 along the second axis and the measured position of component 503 along the first axis. Control system 500 includes similar features as the above described control systems 200, 300, and 400. These similar features are similarly numbered and function substantially the same as they do in control systems 200, 300, and 400.

As shown in FIG. 5, positioning system 501 can include a modeling unit 572. Modeling unit 572 may predict a disturbance (schematically illustrated at 573) detected by position sensor 516 caused by self-excited eigenmode mechanical resonances created by moving component 503 along the second axis with one or more control forces (force$_{42}$ schematically illustrated at 528) applied by positioning module 526. In some embodiments, modeling unit 572 may generate a modeled disturbance signal 566 (for example, a coupling signal). Modeling unit 572 may use any suitable compensation model that describes the mechanical coupling between the first and second axes. In some embodiments, modeling unit 572 can be configured to compensate for an effect of eigenmode coupling between the movement of component 503 along the second axis and a measured position of component 503 along the first axis. Particularly, modeled disturbance signal 566 may indicate the predicted positional displacement along the first axis that is attributed to eigenmode disturbance 573. Modeling unit 572 can use any suitable model description of one or more eigenmode disturbances, for example, disturbance 573, that are being compensated. In some embodiments, modeling unit 572 may be configured to use control force$_{42}$ (528), which moves component 503 along the second axis, in conjunction with the compensation model to generate modeled disturbance signal 566. In some embodiments, the prediction of the measured positional displacement along the first axis can be based on force$_{42}$ (528) applied to component 503. Various eigenmode model structures are known to persons skilled the art. In some embodiments, the model description used by modeling unit 572 can be calibrated using frequency-domain or time-domain optimization methods, among other known calibration methods.

The modeled disturbance signal 566 is combined with actuating signal 508 to generate a compensated actuating signal 570 (for example, a compensated servomechanism error signal). In some embodiments, modeled disturbance signal 566 may be summed with actuating signal 508 using a summer (as shown in FIG. 5) to generate compensated actuating signal 570. Positioning module 510 receives compensated actuating signal 570 and applies one or more control forces (force$_{41}$ schematically illustrated at 512) having certain magnitudes and directions based on compensated actuating signal 570. Accordingly, in some embodiments, disturbance 573 and its resulting motion is hid from positioning module 510. Positioning module 510 can be configured such that force$_{41}$ (512) moves component 303 along the first axis in a manner that compensates for disturbance 573 at sensor 516. In such embodiments, positioning module 510 may ignore a portion of primary feedback signal 504 that is attributed to disturbance 573 so that positioning module 510 does not amplifying any position errors. Thus, positioning system 501 is configured to provide a true position error of component 503 along the first axis to positioning module 510. Accordingly, positional errors attributed to non-rigid body disturbance 573 can be reduced or eliminated.

In some embodiments, a lithographic apparatus incorporates one or more aspects of control systems 300, 400, and 500. For example, a lithographic apparatus can include a positioning system configured to move component 303 along a first, second, and third axes. And the lithographic apparatus can be configured to compensate for an effect of eigenmode coupling between each pair of axes.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (for example, a computing device). For example, a machine-readable medium may include read only memory (ROM); random access memory (RAM); magnetic disk storage media; optical storage media; flash memory devices, or the like. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A lithographic apparatus comprising:
a component; and
a positioning system operatively coupled to the component and comprising:
    a first positioning module configured to generate a first force to move the component along a first axis;
    a sensor configured to measure a position of the component along a second axis;
    a second positioning module configured to generate a second force to move the component along the second axis based on a measured position of the component along the second axis; and
    a modeling unit configured to predict, based on the first force, an effect of eigenmode coupling between movement of the component along the first axis and the measured position of the component along the second axis, wherein an input of the modeling unit is a control force signal from the first positioning module,
    wherein the second positioning module is configured to adjust a magnitude and direction of the second force based on a predicted effect of eigenmode coupling on the measured position of the component along the second axis to compensate for the effect of eigenmode coupling between the movement of the component along the first axis and the measured position of the component along the second axis, and
    wherein the eigenmode coupling between the movement of the component along the first axis and the measured position of the component along the second axis is dynamically decoupled.

2. The lithographic apparatus of claim 1, wherein the positioning system further comprises:
    a second sensor configured to measure a position of the component along a third axis;
    a third positioning module configured to generate a third force to move the component along the third axis based on a measured position of the component along the third axis; and
    a second modeling unit configured to predict, based on the first force, an effect of eigenmode coupling between movement of the component along the first axis and the measured position of the component along the third axis, wherein an input of the second modeling unit is a control force signal from the first positioning module,
    wherein the third positioning module is configured to adjust a magnitude and direction of the third force based on a predicted effect of eigenmode coupling on the measured position of the component along the third axis to compensate for the effect of eigenmode coupling between the movement of the component along the first axis and the measured position of the component along the third axis, and
    wherein the eigenmode coupling between the movement of the component along the first axis and the measured position of the component along the third axis is dynamically decoupled.

3. The lithographic apparatus of claim 1, wherein the positioning system further comprises:
    a second sensor configured to measure a position of the component along the first axis; and
    a second modeling unit configured to predict, based on the second force, an effect of eigenmode coupling between movement of the component along the second axis and the measured position of the component along the first axis, wherein an input of the second modeling unit is a control force signal from the second positioning module,
    wherein the first positioning module is configured to adjust a magnitude and direction of the first force based on a predicted effect of eigenmode coupling on the measured position of the component along the first axis to compensate for the effect of eigenmode coupling between the movement of the component along the second axis and the measured position of the component along the first axis.

4. The lithographic apparatus of claim 1, wherein the first axis is orthogonal to the second axis, and wherein the positioning system is configured to translate the component along the first axis.

5. A method comprising:

moving a component of a lithographic apparatus along a first axis by applying a first force to the component using a first positioning module;

predicting, based on the first force, an effect of eigenmode coupling between movement of the component along the first axis and a measured position of the component along the second axis using a modeling unit, wherein an input of the modeling unit is a control force signal from the first positioning module; and moving the component along the second axis by applying a second force to the component, using a second positioning module, based on a predicted effect of eigenmode coupling between movement of the component along the first axis and a measured position of the component along the second axis so as to compensate for the effect of eigenmode coupling between the movement of the component along the first axis and the measured position of the component along the second axis, wherein the eigenmode coupling between the movement of the component along the first axis and the measured position of the component along the second axis is dynamically decoupled.

6. The method of claim 5, further comprising:

predicting, based on the first force, an effect of eigenmode coupling between movement of the component along the first axis and a measured position of the component along a third axis using a second modeling unit, wherein an input of the second modeling unit is a control force signal from the first positioning module; and moving the component along the third axis by applying a third force to the component, using a third positioning module, based on a predicted effect of eigenmode coupling between movement of the component along the first axis and a measured position of the component along the third axis so as to compensate for the effect of eigenmode coupling between the movement of the component along the first axis and the measured position of the component along the third axis, wherein the eigenmode coupling between the movement of the component along the first axis and the measured position of the component along the third axis is dynamically decoupled.

7. The method of claim 5, further comprising:

predicting, based on the second force, an effect of eigenmode coupling between movement of the component along the second axis and a measured position of the component along the first axis using a second modeling unit, wherein an input of the second modeling unit is a control force signal from the second positioning module; and adjusting a magnitude and direction of the first force applied to the component based on a predicted effect of eigenmode coupling on the measured position of the component along the first axis so as to compensate for an effect of eigenmode coupling between the movement of the component along the second axis and the measured position of the component along the first axis.

8. The method of claim 5, wherein the first axis is orthogonal to the second axis, and wherein moving the component of the lithographic apparatus along the first axis comprises translating the component.

* * * * *